United States Patent
Yasuda et al.

(10) Patent No.: US 10,133,158 B2
(45) Date of Patent: Nov. 20, 2018

(54) IMAGING DEVICE

(71) Applicant: Panasonic Intellectual Property Management Co., Ltd., Osaka (JP)

(72) Inventors: Koji Yasuda, Osaka (JP); Kenji Kusunoki, Osaka (JP); Fumitaka Kikuchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/496,463

(22) Filed: Apr. 25, 2017

(65) Prior Publication Data

US 2018/0107099 A1 Apr. 19, 2018

(30) Foreign Application Priority Data

Oct. 17, 2016 (JP) ................................. 2016-203214
Feb. 13, 2017 (JP) ................................. 2017-024065

(51) Int. Cl.
| | |
|---|---|
| *G03B 17/55* | (2006.01) |
| *H05K 7/20* | (2006.01) |
| *H05K 5/04* | (2006.01) |
| *H05K 1/18* | (2006.01) |
| *H05K 1/02* | (2006.01) |
| *H04N 5/225* | (2006.01) |
| *H04N 5/232* | (2006.01) |

(Continued)

(52) U.S. Cl.
CPC ........... *G03B 17/55* (2013.01); *H04N 5/2252* (2013.01); *G03B 21/16* (2013.01); *G06F 1/20* (2013.01); *H04N 5/23293* (2013.01); *H05K 7/2039* (2013.01); *H05K 7/2049* (2013.01)

(58) Field of Classification Search
CPC ........ G06F 1/1686; F28D 9/005; G03B 17/55
See application file for complete search history.

(56) References Cited

U.S. PATENT DOCUMENTS

| | | | |
|---|---|---|---|
| 8,350,943 B2* | 1/2013 | Park ..................... | H04N 5/2253 348/333.01 |
| 8,600,222 B2* | 12/2013 | Aoki ..................... | G03B 17/08 386/358 |

(Continued)

FOREIGN PATENT DOCUMENTS

| | | |
|---|---|---|
| JP | 2003-008956 A | 1/2003 |
| JP | 2009-229582 A | 10/2009 |

(Continued)

*Primary Examiner* — Hung S. Bui
*Assistant Examiner* — Michael A Matey
(74) *Attorney, Agent, or Firm* — Renner, Otto, Boisselle & Sklar, LLP

(57) ABSTRACT

An electronic device includes: an electronic part; an external case that covers the electronic part and constitutes an exterior; and a heat dissipation frame that transmits heat generated from the electronic part to the external case. The external case includes a top case, a front case, and a rear case, while the heat dissipation frame includes a first heat dissipation frame, a second heat dissipation frame, and a third heat dissipation frame provided independently from each other. Mechanical fixation is made to combine the top case and the first heat dissipation frame into one body, to combine the front case and the second heat dissipation frame into one body, and to combine the rear case and the third heat dissipation frame into one body.

4 Claims, 8 Drawing Sheets

(51) Int. Cl.
*G06F 1/20* (2006.01)
*G03B 21/16* (2006.01)

(56) References Cited

U.S. PATENT DOCUMENTS

| | | | | |
|---|---|---|---|---|
| 8,754,981 B2* | 6/2014 | Iyoda | ............ | H04N 5/2251 248/187.1 |
| 9,609,193 B2* | 3/2017 | Shintani | ............ | G03B 9/40 |
| 9,897,897 B2* | 2/2018 | Kobayashi | ............ | G03B 17/02 |
| 2005/0161587 A1* | 7/2005 | Mihara | ............ | H01L 21/6835 250/214 R |
| 2006/0256199 A1* | 11/2006 | Takahashi | ............ | G02B 7/028 348/207.99 |
| 2007/0109747 A1* | 5/2007 | Sengoku | ............ | H04N 5/2251 361/714 |
| 2009/0237537 A1* | 9/2009 | Maruyama | ............ | G03B 17/02 348/294 |
| 2010/0061716 A1* | 3/2010 | Iyoda | ............ | G03B 17/14 396/535 |
| 2011/0164171 A1* | 7/2011 | Yasuda | ............ | G03B 17/02 348/360 |
| 2011/0234892 A1* | 9/2011 | Yasuda | ............ | G03B 17/02 348/374 |
| 2011/0310564 A1* | 12/2011 | Yamamoto | ............ | G03B 17/02 361/707 |
| 2011/0317062 A1* | 12/2011 | Fujino | ............ | G02B 7/02 348/360 |
| 2012/0314119 A1* | 12/2012 | Tobinaga | ............ | H04N 5/2253 348/335 |
| 2013/0107115 A1* | 5/2013 | Tobinaga | ............ | H04N 5/2253 348/374 |
| 2013/0128105 A1* | 5/2013 | Nunnink | ............ | G03B 17/02 348/374 |
| 2014/0055671 A1* | 2/2014 | Kawamura | ............ | H04N 5/2252 348/374 |
| 2014/0362286 A1* | 12/2014 | Komi | ............ | G06K 7/10732 348/374 |
| 2015/0160536 A1* | 6/2015 | Lang | ............ | H04N 5/2251 348/374 |
| 2015/0181698 A1* | 6/2015 | Suganuma | ............ | H05K 1/111 250/208.1 |
| 2015/0207966 A1* | 7/2015 | Kudoh | ............ | H04N 5/2253 348/374 |
| 2015/0334870 A1* | 11/2015 | Feng | ............ | H05K 7/2039 235/462.21 |
| 2016/0021286 A1* | 1/2016 | Shintani | ............ | G03B 9/40 348/370 |
| 2016/0100505 A1* | 4/2016 | Reid | ............ | H05K 7/20545 361/714 |
| 2016/0360077 A1* | 12/2016 | Miura | ............ | G02B 7/14 |

FOREIGN PATENT DOCUMENTS

| | | |
|---|---|---|
| JP | 2011-061442 A | 3/2011 |
| JP | 2011-229046 A | 11/2011 |

* cited by examiner

IMAGING DEVICE

BACKGROUND

1. Technical Field

The present disclosure relates to an electronic device which includes a heat dissipation structure capable of transmitting heat generated inside the electronic device to an external case to dissipate the heat.

2. Description of the Related Art

In recent years, there has been a demand for a digital camera, an example of electronic devices, which is capable of forming higher-resolution moving images of 4K60P, for example, as well as high-resolution still images. An amount of data to be processed considerably increases with increase in resolution of moving images. Accordingly, a digital camera needs to include a signal processing large scale integration (LSI) or the like achieving higher-speed processing to process higher-pixel still image data and moving image data. In this case, power consumption of the digital camera increases, causing a more serious problem of heat generation.

Unexamined Japanese Patent Publication No. 2011-229046 describes an example of an electronic device which includes a heat dissipation structure. According to this structure, a heat dissipation plate is attached to each of front and rear surfaces of an imaging element to dissipate heat from the imaging element.

SUMMARY

An electronic device according to an aspect of the present disclosure includes: an electronic part; an external case that covers the electronic part and constitutes an exterior; and a heat dissipation frame that transmits heat generated from the electronic part to the external case. The external case includes a top case, a front case, and a rear case, while the heat dissipation frame includes a first heat dissipation frame, a second heat dissipation frame, and a third heat dissipation frame provided independently from each other. Mechanical fixation is made to combine the top case and the first heat dissipation frame into one body, to combine the front case and the second heat dissipation frame into one body, and to combine the rear case and the third heat dissipation frame into one body.

The electronic device according to the aspect of the present disclosure is effective in efficient transmission of heat generated inside the electronic device toward the external case, and dissipation of the transmitted heat. Accordingly, equalization of heat is achievable.

DETAILED DESCRIPTION

An exemplary embodiment is hereinafter described in detail with reference to the drawings. Some of excessively detailed description is omitted. For example, some of detailed description of well-known matters, and repeated description of substantially identical configurations are omitted. These omissions are made to avoid unnecessary redundancy of the following description, and facilitate understanding by those skilled in the art.

Note that the accompanying drawings and following description are only presented by the applicant to help those skilled in the art fully understand the present disclosure. It is therefore not intended that subject matters claimed in the appended claims be limited to these drawings and description.

First Exemplary Embodiment

A first exemplary embodiment is hereinafter described with reference to FIGS. 1 through 8. A digital camera is herein discussed by way of example according to the first exemplary embodiment.

[1-1. External Appearance]

Figure 1A:
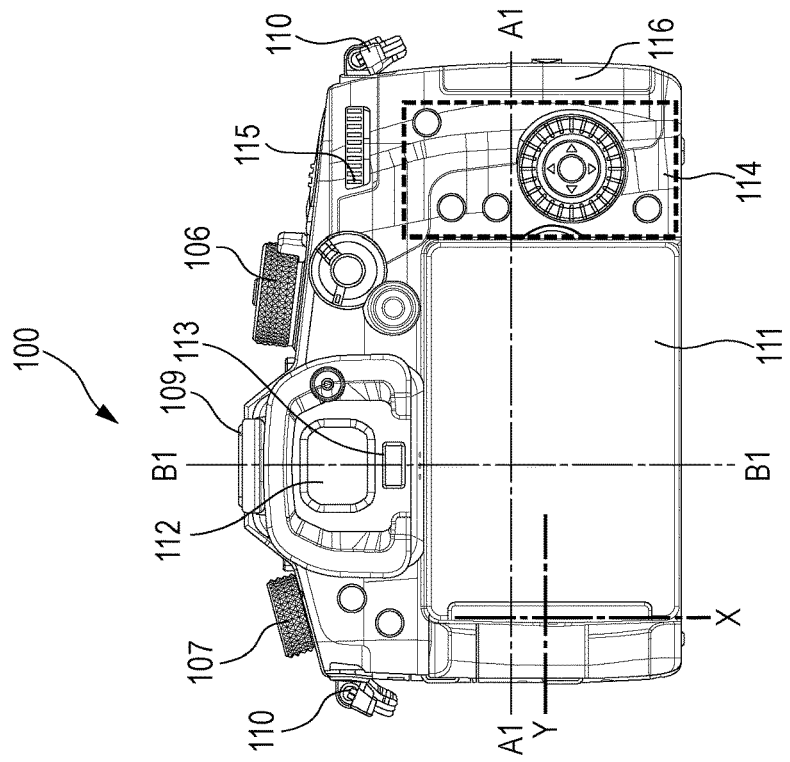
FIG. 1A is an external view of a digital camera according to a first exemplary embodiment.
Figure 1B:
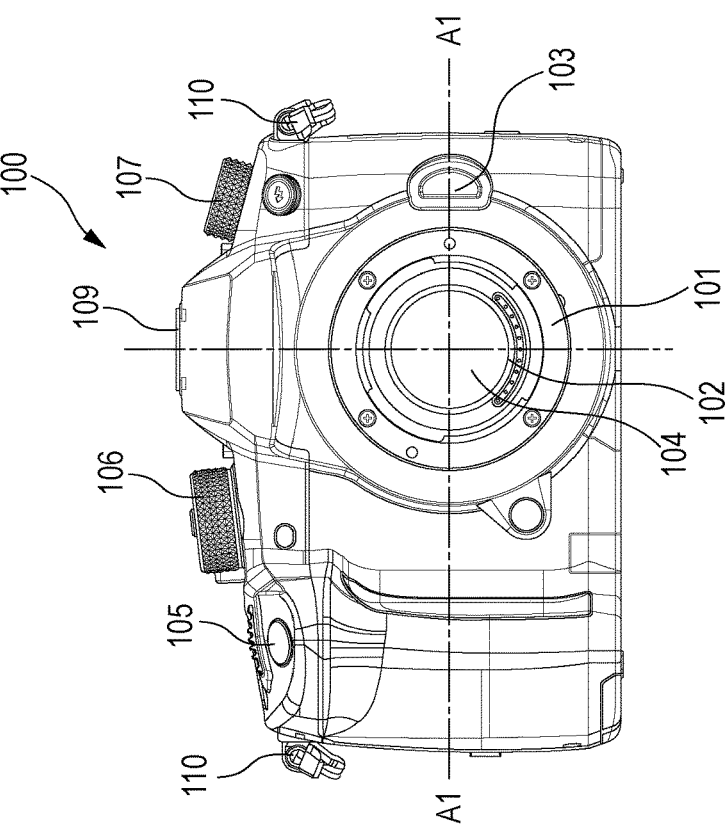
FIG. 1B is an external view of the digital camera according to the first exemplary embodiment.

FIGS. 1A and 1B are external views of the digital camera according to the first exemplary embodiment. FIG. 1A is a front view, while FIG. 1B is a rear view.

Digital camera 100 according to this exemplary embodiment is a lens interchangeable digital camera which allows imaging with an interchangeable lens selected from various types of interchangeable lenses and attached to mount 101. A plurality of electrical contacts 102 are provided in a circular-arc shape in a part of an inner circumference of mount 101. In a state that an interchangeable lens is attached to mount 101, digital camera 100 is allowed to communicate with the interchangeable lens via electrical contacts 102. Digital camera 100 obtains specific information on the interchangeable lens from the interchangeable lens, and controls operations of the interchangeable lens in accordance with imaging conditions. The interchangeable lens is rotatable with a press of lens detachment button 103 to detach the interchangeable lens from mount 101.

Digital camera 100 is not a so-called single-lens reflex camera, and therefore does not include a movable mirror which switches a direction of incident light entering from the interchangeable lens to guide the light either to an imaging element or to an optical view finder. Accordingly, imaging element 104, which is constituted by a complementary metal oxide semiconductor (CMOS) image sensor and disposed inside mount 101, allows direct viewing from a subject side of digital camera 100. However, an ultrasonic filter for removing adhering dust, and an optical low-pass filter for removing high-frequency components of incident light are provided on a front surface of imaging element 104.

Operation parts such as shutter button 105 operated for instruction of imaging, and mode dial 106 and mode dial 107 operated for various settings concerning imaging are provided on a top surface of digital camera 100. Further provided on the top surface of digital camera 100 is hot shoe 109 to which an external stroboscopic device, which emits a large amount of light, is attachable, for example. Metal fitting 110 for engaging with a strap is attached to each of left and right sides of digital camera 100.

Movable monitor 111 is provided on a rear surface of digital camera 100. Movable monitor 111 is constituted by a flat display such as a liquid crystal monitor. An image based on incident light formed on imaging element 104 is displayed on movable monitor 111. FIG. 1B shows a closed state of movable monitor 111. In this state, a display surface of movable monitor 111 faces the digital camera side. Movable monitor 111 is rotatable around an X axis toward the front in FIG. 1B to be opened. Movable monitor 111 is further rotatable around a Y axis. Accordingly, movable monitor 111 is adjustable according to imaging condition, such that the display surface comes to a position allowing visual recognition most easily.

Digital camera 100 includes electronic view finder 112 in addition to movable monitor 111. Electronic view finder 112 is constituted by a small liquid crystal monitor and an eyepiece optical system, and displays an image based on incident light formed on imaging element 104 similarly to movable monitor 111. Electronic view finder 112 is a finder into which a user looks for visual recognition of an image. Accordingly, even in such a situation that visual recognition by movable monitor 111 is difficult in a condition surrounded by excessively bright external light, a clear image is recognizable via electronic view finder 112. Eye sensor 113 is disposed in the vicinity of electronic view finder 112. Eye sensor 113 detects an eye approach to electronic view finder 112. When detecting an eye approach to electronic view finder 112, eye sensor 113 switches display of an image based on incident light formed on imaging element 104 from movable monitor 111 to electronic view finder 112.

Operation parts such as various types of operation buttons 114 including a cross-key, and operation dial 115 are provided on the rear surface of digital camera 100. The user determines detailed settings for imaging, reproduction and the like by operating these operation parts. A slot into which a memory card is inserted is formed in a right side surface of digital camera 100 as viewed from the rear surface of digital camera 100. This slot is covered by cover 116.

[1-2. General Configuration]

Figure 2:
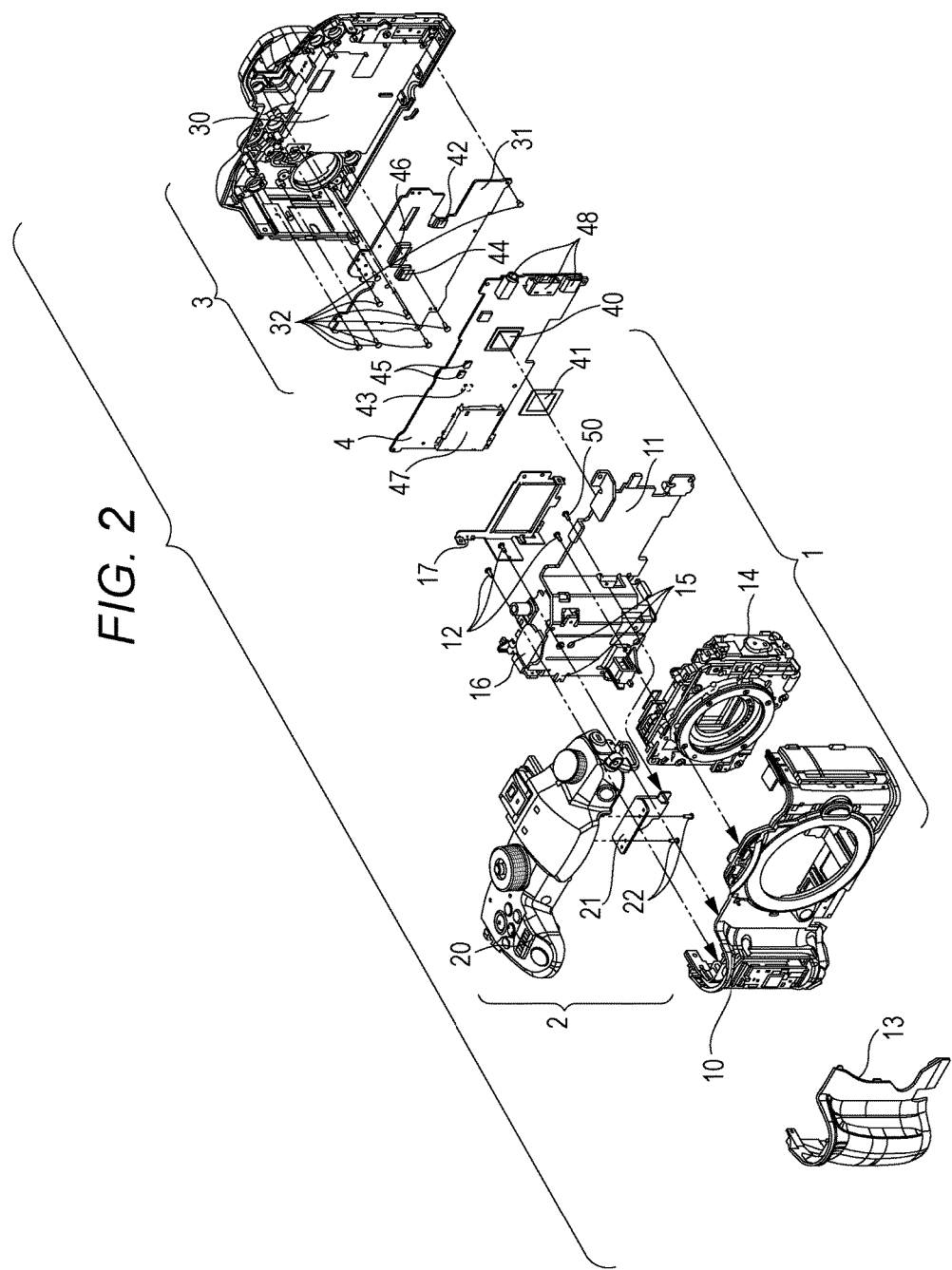
FIG. 2 is an exploded perspective view of the digital camera according to the first exemplary embodiment.

FIG. 2 is an exploded perspective view of the digital camera according to the first exemplary embodiment. Digital camera 100 is constituted by front unit 1, top unit 2, rear unit 3, and main printed circuit board (PCB) 4. Note that FIG. 2 does not show a part of necessary parts such as buttons included in rear unit 3.

Front unit 1 includes front case 10, front grip 13, mount unit 14, and front heat dissipation frame 11 (second heat dissipation frame). Front case 10 corresponds to a case constituting a part of an exterior of digital camera 100. Front case 10 is made of metal achieving excellent heat dissipation, such as aluminum (Al) and magnesium (Mg). Front grip 13 and mount unit 14 are attached to front case 10. Front heat dissipation frame screw fastening portions 15 (screw holes) are formed in front heat dissipation frame 11. Front case 10 and front heat dissipation frame 11 are combined into one body by inserting front heat dissipation frame fixing screws 12 into front heat dissipation frame screw fastening portions 15. In other words, front case 10 and front heat dissipation frame 11 are combined into one body by mechanical fixation. Battery storage cases 16 and 17 are attached to front heat dissipation frame 11. A battery is stored in battery storage cases 16 and 17.

Top unit 2 includes top case 20 and top heat dissipation frame 21 (first heat dissipation frame). Top case 20 constitutes a part of the exterior of digital camera 100. Top case 20 is made of metal achieving excellent heat dissipation, such as Al and Mg. Top case 20 and top heat dissipation frame 21 are combined into one body by top heat dissipation frame fixing screws 22. In other words, top case 20 and top heat dissipation frame 21 are combined into one body by mechanical fixation.

Rear unit 3 includes rear case 30 and rear heat dissipation frame 31 (third heat dissipation frame). Rear case 30 constitutes a part of the exterior of digital camera 100. Rear case 30 is made of metal achieving excellent heat dissipation, such as Al and Mg. Rear case 30 and rear heat dissipation frame 31 are combined into one body by rear heat dissipation frame fixing screws 32. In other words, rear case 30 and rear heat dissipation frame 31 are combined into one body by mechanical fixation.

Main PCB 4 on which electronic parts such as an LSI are mounted is disposed between front heat dissipation frame 11 and rear heat dissipation frame 31. CPU 40, which is constituted by an LSI generating a large amount of heat, is mounted on main PCB 4. Heat generated from CPU 40 is dissipated toward front heat dissipation frame 11 via heat dissipation pad 41 corresponding to a heat dissipation part. Heat dissipation pad 42 corresponding to a heat dissipation part is further disposed on main PCB 4 on a rear side of a surface on which CPU 40 is mounted. Heat generated from CPU 40 is also dissipated from a rear surface of CPU 40 via heat dissipation pad 42. Accordingly, heat generated from CPU 40 is dissipated toward rear dissipation frame 31 via heat dissipation pad 42. Each of heat dissipation pads 41 and 42 is constituted by a heat dissipation sheet or heat dissipation silicon rubber providing high heat dissipation effect, for example. It is preferable that each of heat dissipation pads 41 and 42 be made of material having thermal conductivity of 2 W/m·K or higher. Material of heat dissipation pads 41 and 42 is selected from various types of rubber and resin, such as silicon rubber, acrylic resin, and α-olefin resin.

Power supply integrated circuit (IC) 43 and power supply IC 45 are also provided as parts mounted on main PCB 4 and generating heat, for example. Heat generated from power supply IC 43 is dissipated toward rear heat dissipation frame 31 via heat dissipation pad 44 corresponding to a heat dissipation part. Heat generated from power supply IC 45 is dissipated toward rear heat dissipation frame 31 via heat dissipation pad 46 corresponding to a heat dissipation part. SD card connector 47 and external connection terminals 48 are further mounted on main PCB 4. Heat dissipation pads 44 and 46 are made of material similar to the material of heat dissipation pads 41 and 42.

Top heat dissipation frame 21 and front heat dissipation frame 11 are mechanically fixed via front heat dissipation frame and top heat dissipation frame fixing screw 50 in a state that front unit 1 and top unit 2 are assembled. By fixation between top heat dissipation frame 21 and front heat dissipation frame 11 in this manner, heat generated from CPU 40, which generates a large amount of heat in a state in contact with front heat dissipation frame 11, is also dissipated efficiently toward top case 20 via top heat dissipation frame 21.

Note that each of front heat dissipation frame 11, top heat dissipation frame 21, and rear heat dissipation frame 31 is made of metal achieving excellent heat dissipation, such as copper (Cu) and Al.

[1-3. Heat Dissipation Path]

Figure 3:
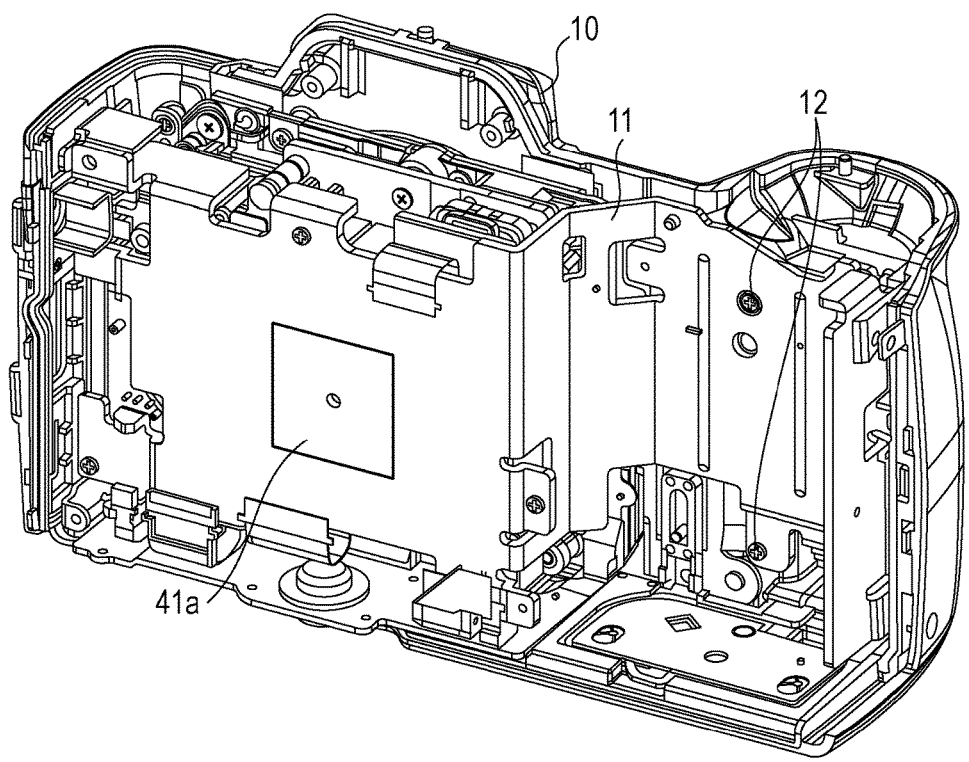
FIG. 3 is a perspective view illustrating a fastened state of a front unit of the digital camera.

FIG. 3 is a perspective view illustrating a fastened state of the front unit of the digital camera. As illustrated in FIG. 3, front heat dissipation frame 11 of front unit 1 is fastened to front case 10 via front heat dissipation frame fixing screws 12. In other words, front case 10 is combined with front heat dissipation frame 11 into one body via a mechanical fixing means. Note that area 41a is an area in which heat dissipation pad 41 is disposed.

Figure 4:
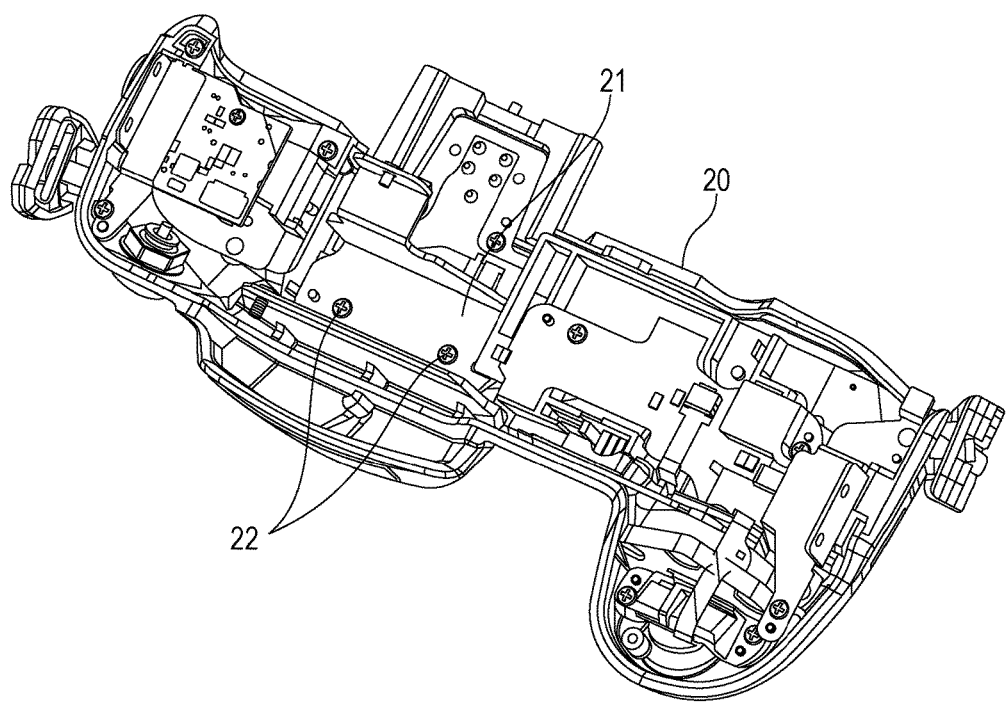
FIG. 4 is a perspective view illustrating a fastened state of a top unit of the digital camera.

FIG. 4 is a perspective view illustrating a fastened state of the top unit of the digital camera. As illustrated in FIG. 4, top heat dissipation frame 21 of top unit 2 is fastened to top case 20 via top heat dissipation frame fixing screws 22. In other words, top case 20 is combined with top heat dissipation frame 21 into one body via a mechanical fixing means.

Figure 5:
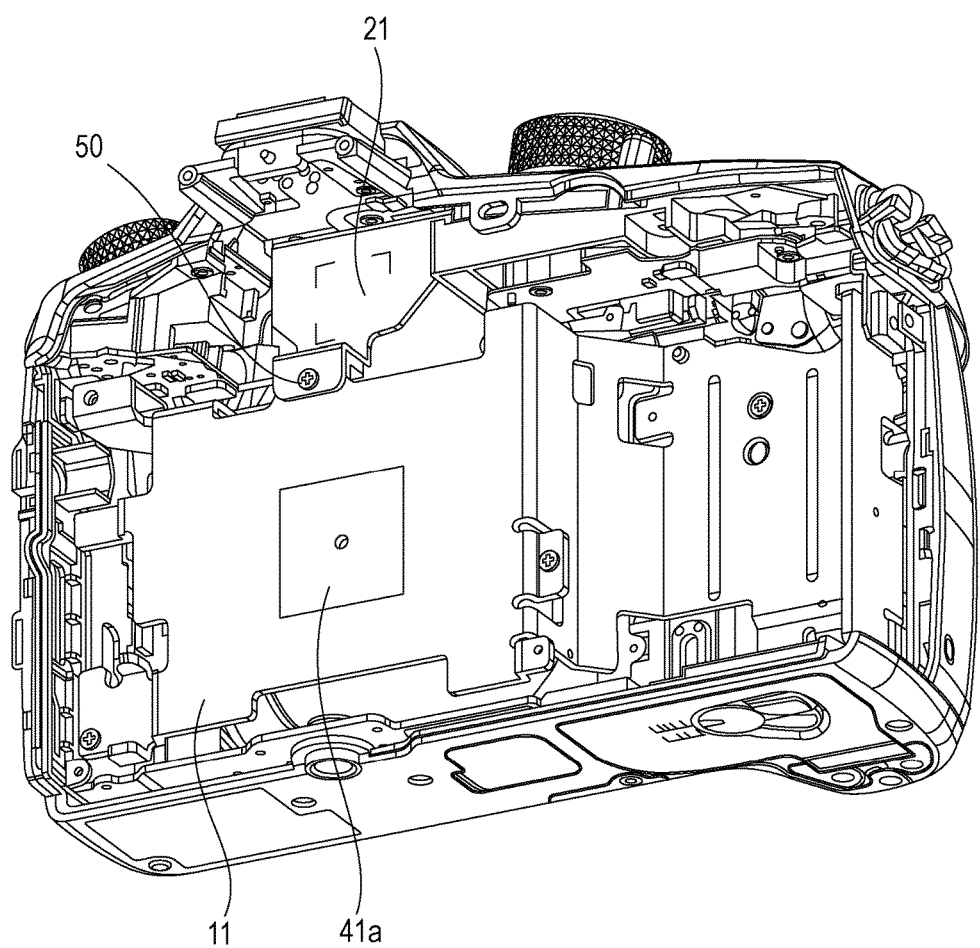
FIG. 5 is a perspective view illustrating a fastened state of the front unit and the top unit of the digital camera.

FIG. 5 is a perspective view illustrating a fastened state of the front unit and the top unit of the digital camera. As illustrated in FIG. 5, a part constituted by front case 10 and front heat dissipation frame 11 fastened to front case 10 as illustrated in FIG. 3, and a part constituted by top case 20 and top heat dissipation frame 21 fastened to top case 20 as illustrated in FIG. 4 are fastened to each other via front heat dissipation frame and top heat dissipation frame fixing screw 50. More specifically, front heat dissipation frame 11 and top heat dissipation frame 21 are combined into one body via front heat dissipation frame and top heat dissipation frame fixing screw 50. As a result, heat dissipation paths described below are connected to extend from front heat dissipation frame 11 toward top heat dissipation frame 21.

Figure 6:
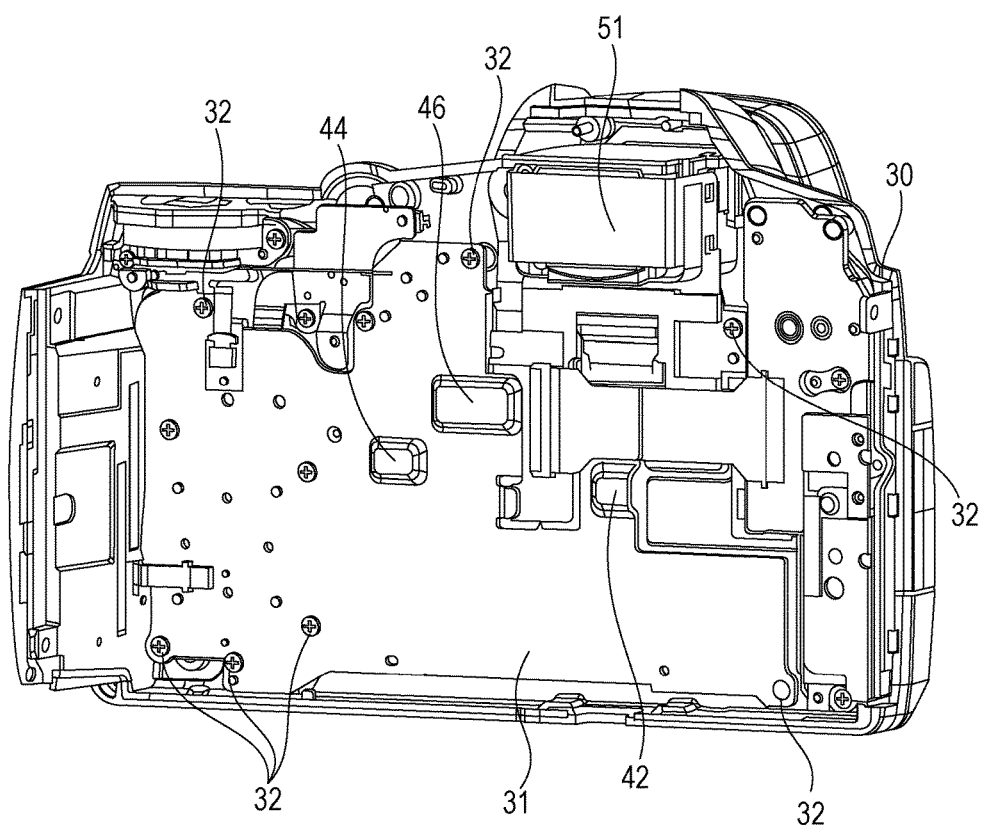
FIG. 6 is a perspective view illustrating a fastened state of a rear unit of the digital camera.

FIG. 6 is a perspective view illustrating a fastened state of the rear unit of the digital camera. As illustrated in FIG. 6, rear heat dissipation frame 31 of rear unit 3 is fastened to rear case 30 via rear heat dissipation frame fastening screws 32. In other words, rear case 30 is combined with rear heat dissipation frame 31 into one body via a mechanical fixing means. Note that heat dissipation pads 42, 44, and 46 are disposed on rear heat dissipation frame 31.

The heat dissipation paths and the like are hereinafter described with reference to FIGS. 7 and 8.

Figure 7:
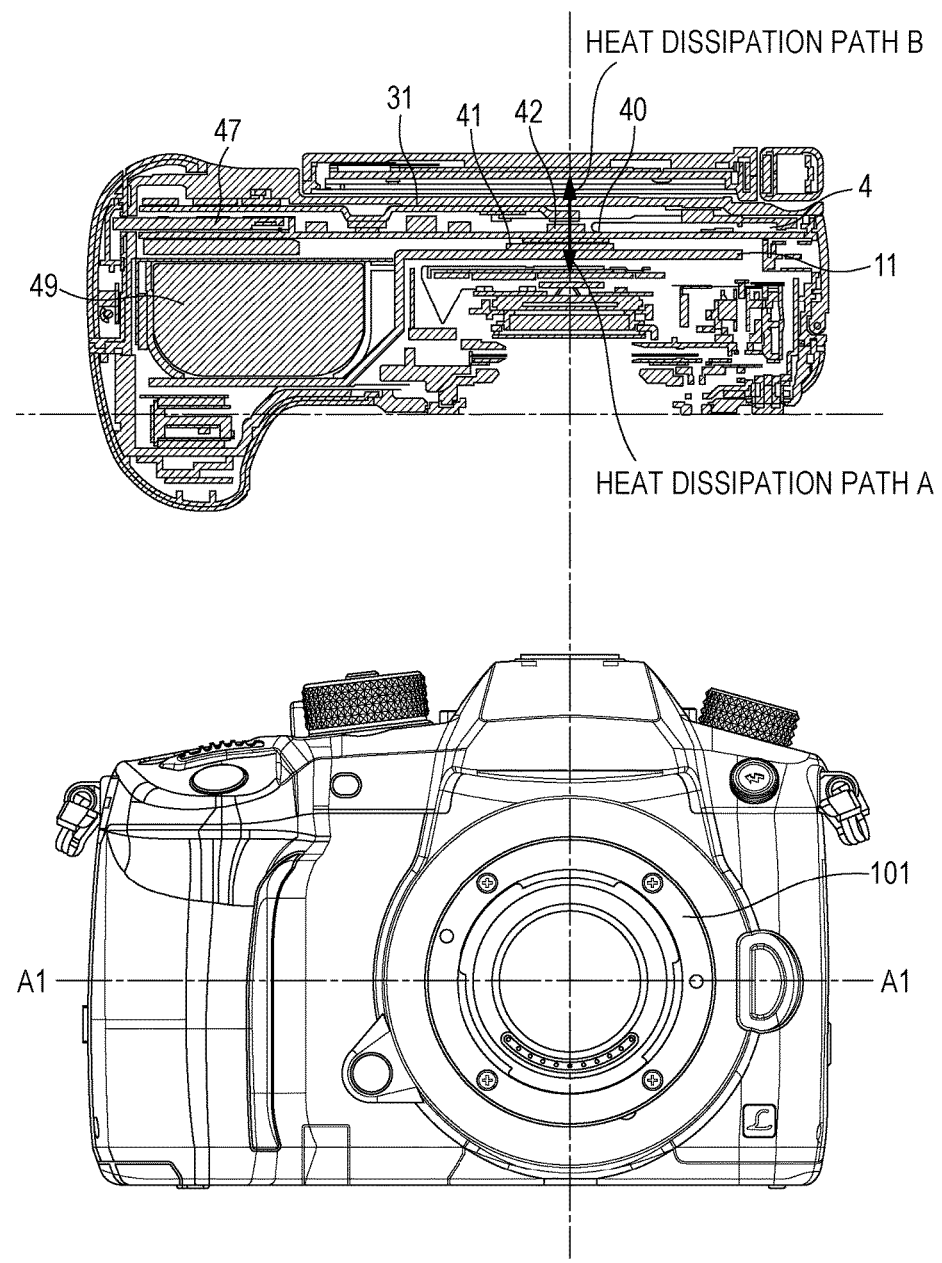
FIG. 7 is a view illustrating a cross section of the digital camera according to the first exemplary embodiment, taken along a line A1-A1.

A lower part of FIG. 7 is a front view of digital camera 100. An upper part of FIG. 7 is a cross-sectional view of digital camera 100 taken along a line A1-A1 in the front view of FIG. 7. As illustrated in FIG. 7, front heat dissipation frame 11 has a shape following a shape of battery 49. Front heat dissipation frame 11 and rear heat dissipation frame 31 are disposed such that substrates on which electronic parts such as CPU 40 are mounted (such as main PCB 4) are sandwiched between front heat dissipation frame 11 and rear heat dissipation frame 31. In addition, CPU 40 contacts front heat dissipation frame 11 and rear heat dissipation frame 31 via heat dissipation pads 41 and 42 made of material having high heat conductivity.

FIG. 7 shows two heat dissipation paths (heat dissipation path A and heat dissipation path B). Heat generated from CPU 40 is transmitted to front heat dissipation frame 11 via heat dissipation pad 41 in heat dissipation path A. The heat transmitted to front heat dissipation frame 11 is then dissipated toward front case 10 made of metal material having high heat conductivity. Heat generated from CPU 40 is also transmitted to rear heat dissipation frame 31 via heat dissipation pad 42 disposed on the rear surface of main PCB 4 (surface opposite to the surface on which CPU 40 is disposed) in heat dissipation path B. The heat transmitted to rear heat dissipation frame 31 is then dissipated toward rear case 30 made of metal material having high heat conductivity.

Figure 8:
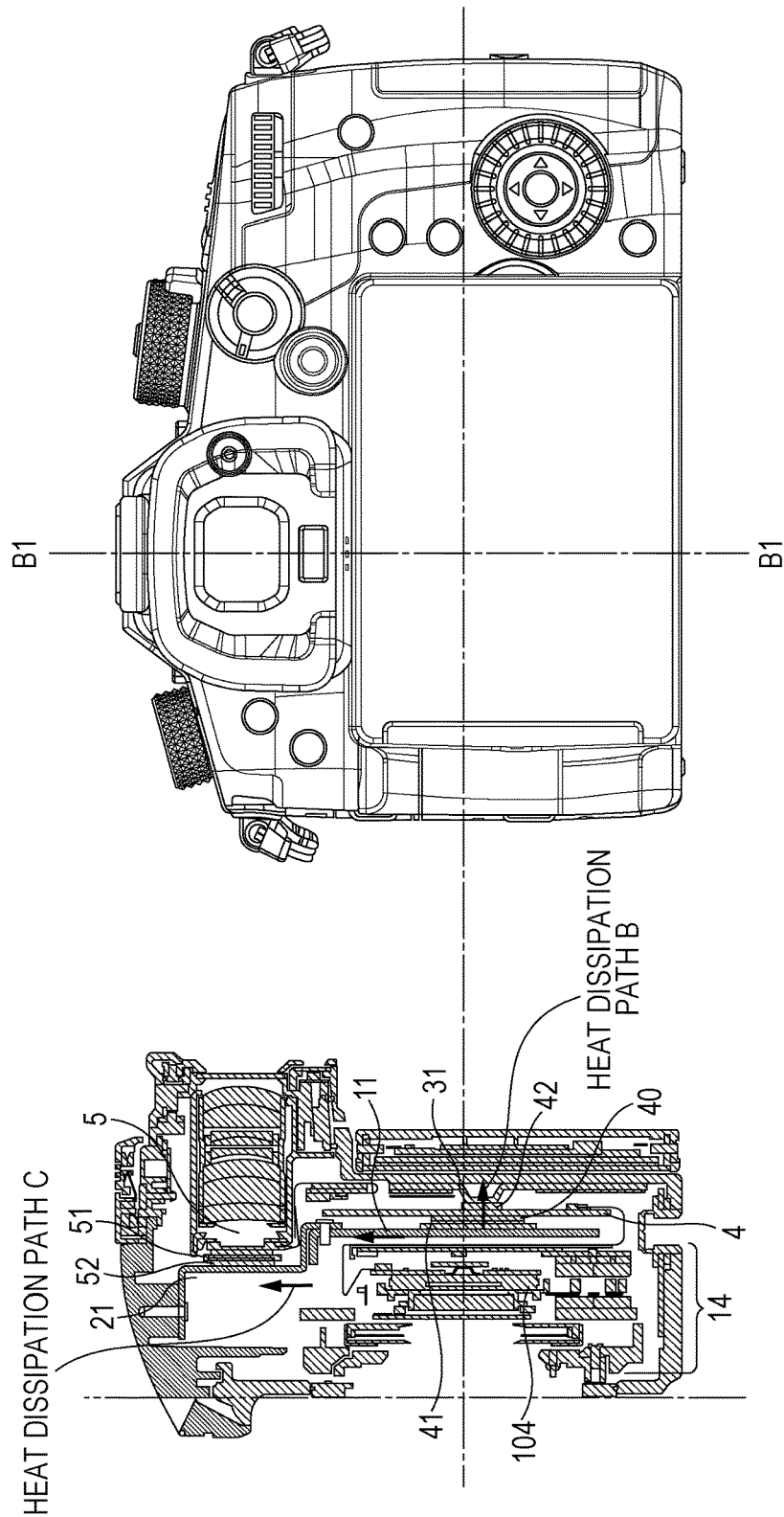
FIG. 8 is a view illustrating a cross section of the digital camera according to the first exemplary embodiment, taken along a line B1-B1.

A right part in FIG. 8 is a rear view of digital camera 100. A left part of FIG. 8 is a cross-sectional view of digital camera 100 taken along a line B1-B1 in FIG. 8. As illustrated in FIG. 8, heat dissipation pad 52 is disposed on a rear surface of finder module 5 which generates heat, and contacts finder module heat dissipation frame 51. In a completely assembled state, heat dissipation pad 52 and top heat dissipation frame 21 contact each other to dissipate heat generated from finder module 5 toward top heat dissipation frame 21. In addition, mount unit 14 on which imaging element 104 and others are mounted is disposed before front heat dissipation frame 11 in a direction toward a subject. Heat dissipation pad 52 is made of material similar to the material of heat dissipation pads 41 and 42.

FIG. 8 shows two heat dissipation paths (heat dissipation path B and heat dissipation path C). Heat dissipation path B is identical to heat dissipation path B discussed above. In heat dissipation path C, a part of heat transmitted to front heat dissipation frame 11 in heat dissipation path A is further transmitted to top heat dissipation frame 21 mechanically fixed to front heat dissipation frame 11. The heat transmitted to top heat dissipation frame 21 is subsequently dissipated toward top case 20 made of metal material having high heat conductivity.

As described above, digital camera 100 according to the present disclosure includes the three heat dissipation paths (heat dissipation paths A, B and C), and therefore more uniformly dissipates heat generated from electronic parts (CPU 40, power supply ICs 43 and 45, and others) via the three dissipation paths (heat dissipation paths A, B, and C) in comparison with a configuration which uses two heat dissipation paths. Accordingly, digital camera 100 achieves excellent heat dissipation effect, and uniformly guides heat toward the metal cases (front case 10, top case 20, and rear case 30) of the external appearance in contact with an air layer. Digital camera 100 therefore reduces malfunctions of digital camera 100 caused by a large amount of heat generated from electronic parts such as CPU 40.

[1-4. Summary]

As described above, in the present exemplary embodiment, digital camera 100 presented as an example of an electronic device includes: an electronic part (CPU 40, power supply IC 43, power supply IC 45, for example); an external case (front case 10, top case 20, rear case 30) that covers the electronic part and constitutes an exterior; and a heat dissipation frame (front heat dissipation frame 11, top heat dissipation frame 21, rear heat dissipation frame 31) that transmits heat generated from the electronic part to the external case. Front heat dissipation frame 11, top heat dissipation frame 21, and rear heat dissipation frame 31 are parts provided independently from each other. Mechanical fixation is made via a mechanical fixing means (front heat dissipation frame fixing screws 12) to combine front case 10 and front heat dissipation frame 11 into one body. Mechanical fixation is made via a mechanical fixing means (top heat dissipation frame fixing screws 22) to combine top case 20 and top heat dissipation frame 21 into one body. Mechanical fixation is made via a mechanical fixing means (rear heat dissipation frame fixing screws 32) to combine rear case 30 and rear heat dissipation frame 31 into one body.

This configuration is effective in efficient transmission of heat generated inside the electronic device toward the external case, and dissipation of the transmitted heat. Accordingly, equalization of heat is achieved.

Each of front case 10, top case 20, and rear case 30 is a separate part. Each of front case 10, top case 20, and rear case 30 is made of metal material having high heat conductivity. This configuration is effective in efficient dissipation of heat generated inside the electronic device.

The electronic device further includes a substrate (such as main PCB 4) on which the electronic part is mounted. Front heat dissipation frame 11 and rear heat dissipation frame 31 are disposed such that the substrate is sandwiched between front heat dissipation frame 11 and rear heat dissipation frame 31. This configuration is effective in efficient transmission of heat generated inside the electronic device toward the external case, and dissipation of the transmitted heat. Accordingly, equalization of heat is achieved.

The heat dissipation frame (front heat dissipation frame 11, rear heat dissipation frame 31) and the electronic part contact each other via material having high heat conductivity (heat dissipation pad 41, heat dissipation pad 42, heat dissipation pad 46). This configuration is effective in efficient transmission of heat generated inside the electronic device toward the external case, and dissipation of the transmitted heat. Accordingly, equalization of heat is achievable.

Other Exemplary Embodiments

The first exemplary embodiment has been described herein by way of example practicing the present disclosure. However, the present disclosure is not limited to the foregoing exemplary embodiment, but may be applicable to exemplary embodiments including modifications, replacements, additions, omissions and the like in appropriate manners.

These different exemplary embodiments are collectively described hereinbelow.

According to the first exemplary embodiment, the heat dissipation structure of the present disclosure is applied to a lens-interchangeable digital camera not including a movable mirror. However, the present disclosure is applicable to a so-called single-lens reflex camera including a movable mirror, and a digital camera of types other than a lens interchangeable type.

According to the first exemplary embodiment, imaging element 104 is constituted by a CMOS image sensor. However, imaging element 104 may be selected from other types of image sensors, such as a charge coupled device (CCD) image sensor, and an n-channel metal-oxide semiconductor (NMOS) image sensor.

Provided according to the present disclosure is an electronic device achieving higher heat dissipation efficiency. Accordingly, the present disclosure is applicable to imaging devices such as a digital camera. More specifically, the present disclosure is applicable to electronic devices such as a digital camera, a recording and reproducing device (movie), a cellular phone with a camera function, and a smart phone.

What is claimed is:

1. An imaging device comprising:
   an image sensor,
   a substrate on which an electronic part is mounted;
   an external case that covers the electronic part and constitutes an exterior; and
   a heat dissipation frame that transmits heat generated from the electronic part to the external case,
   wherein
   the external case includes a top case, a front case, and a rear case, and each of the top case, the front case, and the rear case forms an outermost portion of the external case,
   the heat dissipation frame includes a first heat dissipation frame, a second heat dissipation frame before which in a direction toward a subject the image sensor is disposed, and a third heat dissipation frame provided independently from each other,
   the substrate is sandwiched between the second heat dissipation frame and the third heat dissipation frame, and
   mechanical fixation is made to combine the top case and the first heat dissipation frame into one body such that the first heat dissipation frame directly transfers heat to the top case, to combine the front case and the second heat dissipation frame into one body such that the second heat dissipation frame directly transfers heat to the front case, and to combine the rear case and the third heat dissipation frame into one body such that the third heat dissipation frame directly transfers heat to the rear case.

2. The imaging device according to claim 1, wherein
   each of the top case, the front case, and the rear case is a separate part, and
   each of the top case, the front case, and the rear case is made of a metal material having high heat conductivity.

3. The imaging device according to claim 2, wherein
   the second heat dissipation frame and the electronic part contact each other via a heat dissipation part made of a material having high heat conductivity, and
   the third heat dissipation frame and the electronic part contact each other via another heat dissipation part made of a material having high heat conductivity.

4. The imaging device according to claim 1, wherein
   the first heat dissipation frame and the second heat dissipation frame are mechanically fixed to one another.

* * * * *